United States Patent
Wu

(10) Patent No.: US 7,714,657 B2
(45) Date of Patent: May 11, 2010

(54) LOW NOISE AMPLIFIER GAIN CONTROLLED SCHEME

(75) Inventor: Chia-hsin Wu, Shulin (TW)

(73) Assignee: Mediatek Inc., Hsin-Chu (TW)

( * ) Notice: Subject to any disclaimer, the term of this patent is extended or adjusted under 35 U.S.C. 154(b) by 55 days.

(21) Appl. No.: 12/033,656

(22) Filed: Feb. 19, 2008

(65) Prior Publication Data

US 2009/0206932 A1 Aug. 20, 2009

(51) Int. Cl.
*H03G 3/10* (2006.01)
(52) U.S. Cl. .......................... 330/284; 330/292; 330/311
(58) Field of Classification Search ................ 330/278, 330/279, 284, 292, 311
See application file for complete search history.

(56) References Cited

U.S. PATENT DOCUMENTS

| | | | |
|---|---|---|---|
| 6,175,274 B1 | 1/2001 | Groe | |
| 6,496,072 B2 * | 12/2002 | Cho et al. | 330/284 |
| 6,768,377 B2 | 7/2004 | Macedo | |
| 6,801,089 B2 * | 10/2004 | Costa et al. | 330/311 |
| 6,822,518 B1 | 11/2004 | Lin et al. | |
| 6,963,247 B2 * | 11/2005 | Sivonen et al. | 330/302 |
| 2003/0181181 A1 | 9/2003 | Darabi | |

OTHER PUBLICATIONS

Madjid Hafizi et al. RF Front-End of Direct Conversion Reciever RFIC for CDMA-2000 IEEE Journal of Solid-State Circuits, vol. 39, No. 10, Oct. 2004 p. 1622-p. 1632.
Robert G. Meyer et al. A 2.5GHz BiCMOS Transceiver for Wireless LAN ISSCC97 / Feb. 8, 1997 / Salon 7 / 11:15 AM.
Vladimir Aparin et al. A Highly-Integrated Tri-Band/Quad-Mode SiGe BiCMOS RF-to-Baseband Receiver for Wireless CDMA/WCDMA/AMPS Applications with GPS Capability ISSCC 2002 / SESSION 14 / Cellular RF Wireless / 14.3.

* cited by examiner

*Primary Examiner*—Khanh V Nguyen
(74) *Attorney, Agent, or Firm*—Kirton & McConkie; Evan R. Witt

(57) ABSTRACT

An amplifier includes an amplifier module coupled to an input node, and an attenuating module. The attenuating module includes an attenuation resistor coupled to the input node, and an impedance compensation module coupled to the input node. The impedance compensation module compensates an input impedance when an input RF signal is attenuated by the attenuating module.

19 Claims, 3 Drawing Sheets

LOW NOISE AMPLIFIER GAIN CONTROLLED SCHEME

BACKGROUND OF THE INVENTION

1. Field of the Invention

The present invention relates to an amplifier used in radio frequency electronics, and more specifically, to a low noise amplifier in radio frequency electronics.

2. Description of the Related Art

As development of wireless communication technology has been accelerating, the rapid progressions in the wireless communication devices succeed in reaching the ubiquitous connection possible. Radio Frequency (RF) transceivers are important components for wireless communication devices. The majority of the RF Integrated Circuits (ICs) used in the wireless communication devices were implemented using either GaAs or silicon bipolar technologies. In recent years, when the Complementary Metal-Oxide-Semiconductor (CMOS) technology brought the cutoff frequency ($f_T$) of MOS transistors up to multi-tens of GHz, such RF ICs are capable of being built in CMOS technology. An advantage of using CMOS radio frequency transceivers is to provide digital functions easily. As a result, it is possible to incorporate the whole system on one single chip yielding to low cost wireless devices. Low Noise Amplifiers (LNAs) are one of the most important building blocks in the front end of wireless communication devices, and are used in a wide variety of applications such as wireless RF communication devices including wireless computer networks and mobile phones. For LNAs, the gain linearity applied to a signal is an important operating characteristic, especially when the input signal becomes higher. Basically, the low noise amplifier must meet simultaneous low noise and high linearity, and the noise contribution from the LNA may be negligible compared to the input signal. In fact, the linearity of the LNA becomes the most important factor. The gain linearity is typically related to the transconductance of a MOSFET in an input stage of the amplifier. For example, the transconductance of a MOSFET operating in the saturation region is constant only when the input signal is lower; when the input signal is higher, the transconductance may vary as a function of the input signal, thus, leading to nonlinear amplification of the signal. In order to overcome the problem of nonlinear amplification, source degeneration may be employed to increase the linearity of the input stage. However, at higher frequencies source degeneration may not be effective due to the large parasitic capacitance of the device. Also, source degeneration may increase power consumption due to the relative low gm/Id for the MOSFET in comparison with a bipolar device. Traditionally, the use of an inductor is a way to achieve the purpose of source degeneration. Nevertheless, because the inductor has larger area, and the impedance of the inductor is associated with its operating frequency. In addition, gain control is also very important in practical applications since the gain of the LNA could vary with process and temperature if not properly controlled.

SUMMARY OF THE INVENTION

It is therefore a primary objective of the claimed invention to provide a low noise amplifier having improved structure to solve the above prior art problems.

Briefly summarized, the claimed invention provides An amplifier includes an amplifier module coupled to an input node, and an attenuating module. The attenuating module includes an attenuation resistor coupled to the input node, and an impedance compensation module coupled to the input node. The impedance compensation module compensates an input impedance when an input RF signal is attenuated by the attenuating module.

In one aspect of the present invention, the impedance compensation module comprises a switch, and a resistor coupled to the switch. The switch is implemented by a transistor. The impedance compensation module further comprises a capacitor coupled between the switch and the resistor.

In another aspect of the present invention, the amplifier amplifying the input RF signal through the amplifier module in a first gain mode and amplifying the input RF signal through the second amplifier module in a second gain mode.

In yet another aspect of the present invention, the amplifier module comprises a first transistor and a second transistor. The first and the second transistors are turned off in the second gain mode.

In still another of the present invention, the attenuating module comprises a third transistor which is turned off in a first gain mode.

In still another of the present invention, the amplifier comprises an input impedance matching unit coupled to the amplifier module. The input impedance matching unit is an inductor. The amplifier further comprises a load impedance module having a plurality of output ends coupled to the amplifier through an impedance circuit.

According to the claimed invention, an attenuating module comprises a transistor, an attenuation resistor coupled to an input of the transistor, and an impedance compensation module coupled to the attenuation resistor. The impedance compensation module compensates an input impedance when an input RF signal is amplified by the attenuating module.

In one aspect of the present invention, the impedance compensation module comprises a switch, and a resistor coupled to the switch which is implemented by a transistor. The impedance compensation module further comprises a capacitor coupled between the switch and the resistor.

According to the claimed invention, method for attenuating an RF signal comprises the steps of attenuating an amplitude of an input RF signal by an attenuation resistor, and compensating an input impedance by an impedance compensation module, the impedance compensation module comprising a resistor and a switch.

In one aspect of the present invention, the impedance compensation module further comprises a capacitor coupled to the resistor and the switch in series.

It is an advantage of the claimed invention that the first resistor allows the bandwidth of the LNA to be increased and the operating range to be flattened.

It is an a further advantage of the claimed invention that, in low gain mode, the first resistor is capable of attenuating the RF signal, and a parallel connection of the first and second resistors is capable of maintaining the input impedance of the low noise amplifier to provide a linearity of the low noise amplifier.

These and other objectives of the claimed invention will no doubt become obvious to those of ordinary skill in the art after reading the following detailed description of the preferred embodiment that is illustrated in the various figures and drawings.

DETAILED DESCRIPTION OF THE PREFERRED EMBODIMENT

Figure 1:
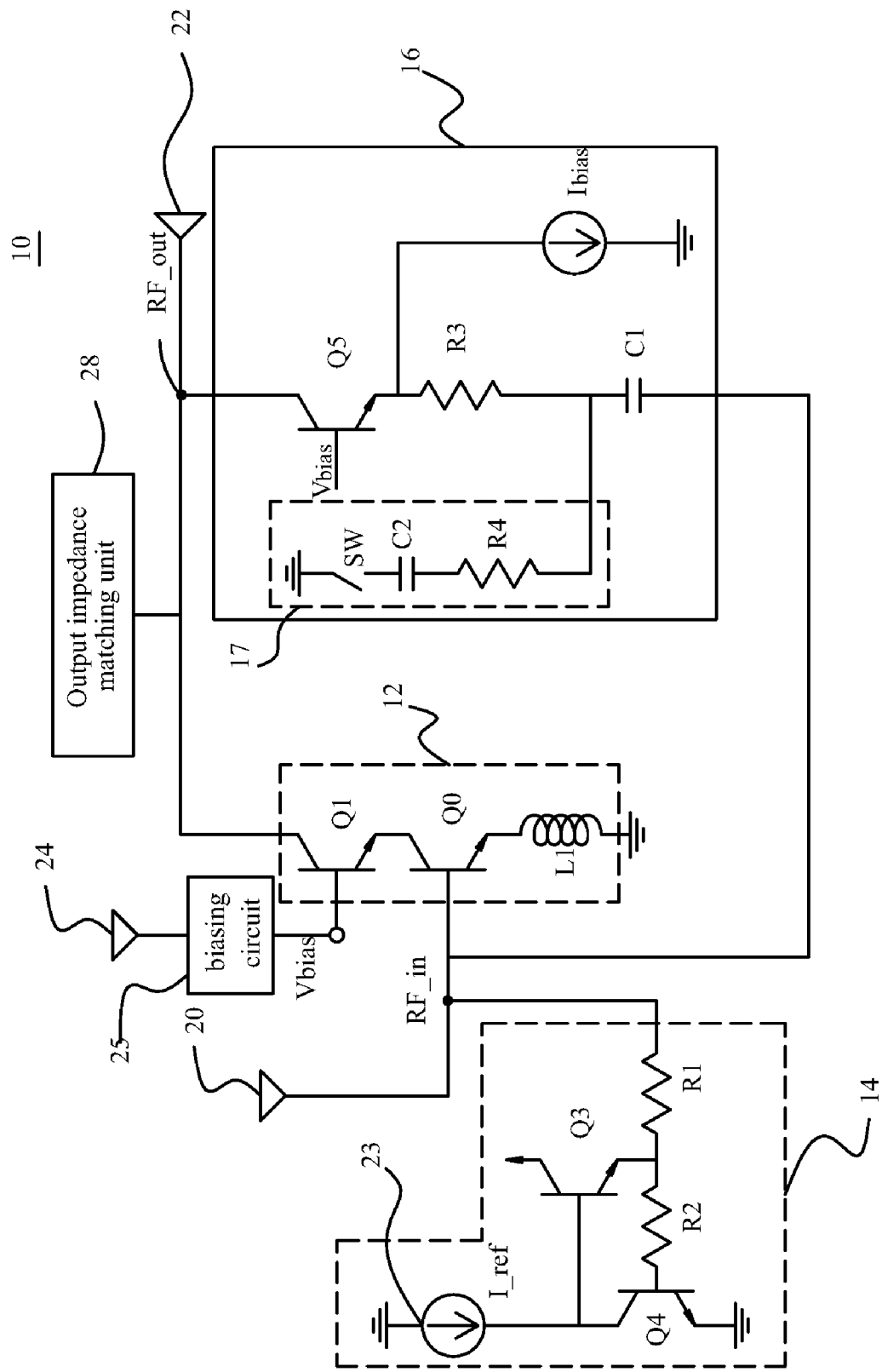
FIG. 1 shows a circuit diagram of a low noise amplifier 10 in accordance with the present invention.

Please refer to FIG. 1, which shows a circuit diagram of a low noise amplifier 10 in accordance with the present invention. The low noise amplifier (LNA) 10 comprises a high gain amplifier module 12, a DC biasing generator 14, and a low gain attenuating module 16, which are integrated in a single integrated circuit (IC) chip. The low gain attenuating module 16 comprises an attenuation resistor R3 and an impedance compensation module 17. In addition, the LNA 10 may also operate with an off-chip input impedance matching unit 26 (See FIG. 2) and an output impedance matching unit 28, for respectively input and output impedance matching, which will be detailed below.

Figure 2:
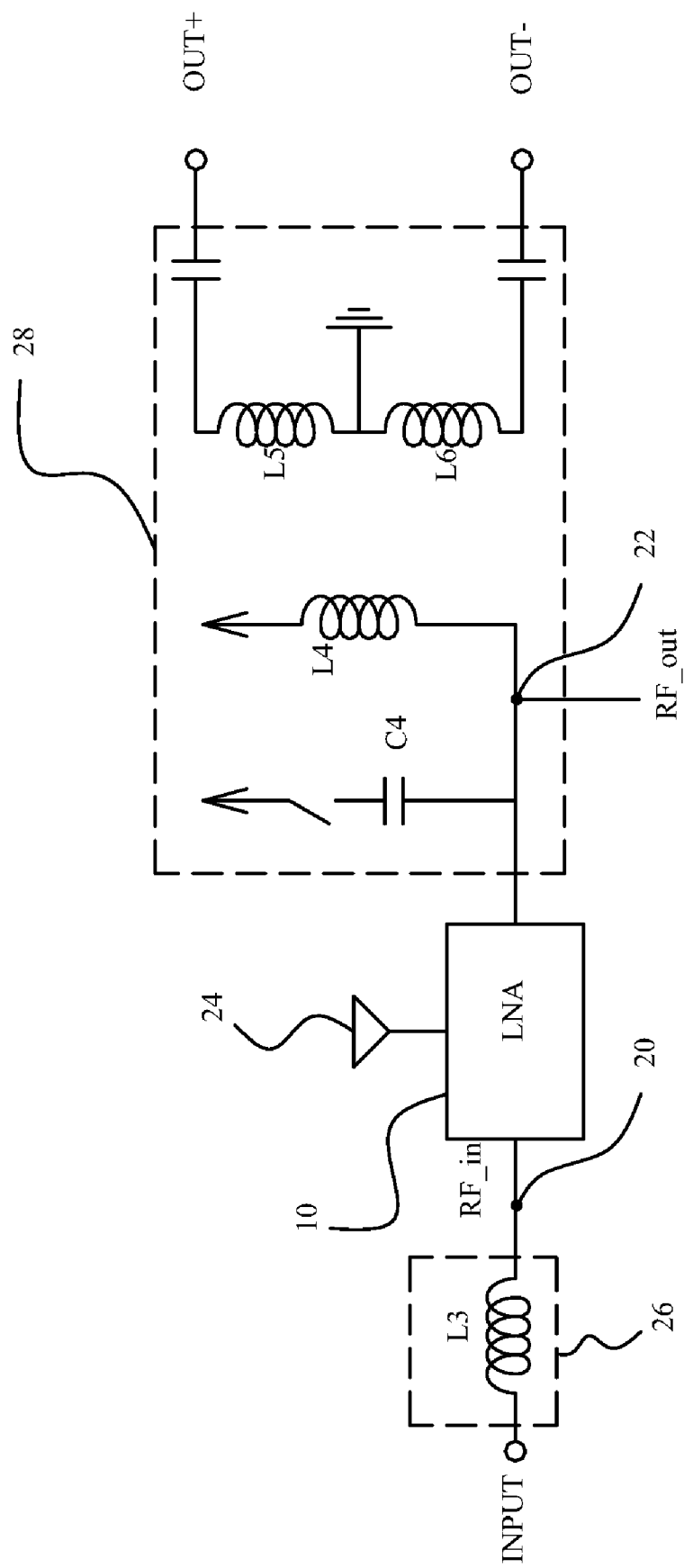
FIG. 2 shows a diagram illustrating an input impedance circuit and the load impedance module for the low noise amplifier depicted in FIG. 1.

Please refer to FIG. 2 in conjunction to FIG. 1, which shows a diagram illustrating the off-chip input impedance matching unit 26 and output impedance matching unit 28, cooperated with the low noise amplifier 10 depicted in FIG. 1.

As depicted in FIGS. 1 and 2, the LNA 10 can be alternatively switched between two modes, a high gain mode and a low gain mode. When the LNA 10 is in the high gain mode, an RF input signal 20 from an RF input end (RF_in) is amplified by the high gain amplifier module 12 and the DC biasing generator 14 to generate an RF output signal 22 at an RF output end (RF_out). When the LNA 10 is in the low gain mode, the DC biasing generator 14 is disabled and the low gain attenuating module 16 is enabled. The RF input signal 20 is fed to compensate the RF output 22 signal through the low gain attenuating module 16 instead of the high gain amplifier module 12. In this manner, when a high-power RF input signal 20 is received without requirement of amplification, the power to be consumed can be conserved. Finally, the output impedance matching circuit 28 contains one or more output ends OUT+ and OUT−. For example, two output ends OUT+ and OUT− are shown in FIG. 2, functioning as dual input ends of a following block, coupled to the RF output end (RF_out) through several inductors L4, L5, L6 and a capacitor C4.

Further referring to FIG. 1, the high gain amplifier module 12 includes two bipolar transistors Q0 and Q1, and a degeneration inductor L1. The bipolar transistors Q0 and Q1 are preferably sized to achieve high gain and a minimum noise figure. The base of the bipolar transistor Q0 is coupled to the RF input end (RF_in) and is also coupled to the DC biasing generator 14 to form a current mirror. The emitter of the bipolar transistor Q1 is connected to the collector of the bipolar transistor Q0, while the base of the bipolar transistor Q1 receives a bias voltage ($V_{bias}$) controlled by a biasing circuit 25 based on a gain control signal. As the low control mode signal is enabled, the bias voltage ($V_{bias}$) is disabled, and thus the bipolar transistor Q1 is off. The degeneration inductor L1 is preferably coupled between ground and the emitter of the bipolar transistor Q1 in order to improve the linearity of the high gain amplifier module 12. The DC biasing generator 14 preferably includes a bipolar transistor Q4 having a base coupled to the high gain amplifier module 12 through resistors R1, R2, and an collector receiving a DC reference current (I_ref) 23. Preferably, the DC reference current (I_ref) 23 is generated by a band gap reference circuit to be stable and independent of temperature and supply voltage. The resistances of the resistors R1, R2 control the amount of current gain in the current mirror, and thus determine the current of the bipolar transistor Q0. When the LNA 10 is in high-gain mode, the current through the bipolar transistors Q0, Q1, the degeneration inductor L1 and the off-chip input impedance matching unit 26 (see FIG. 2) define the gain applied to the RF input signal 20.

When the LNA 10 is in the high-gain mode, the gain control signal 24 is disabled, and the biasing circuit 25 provides the bias voltage ($V_{bias}$) to switch the transistor Q1 on, as well as the DC reference current (I_ref) 23 is on, activating the DC biasing generator 14. The DC reference current (I_ref) 23 is amplified by the bipolar transistors Q0, Q1, thus amplifying the RF input signal 20 at the base of transistor Q0 to generate the RF output signal 22.

Preferably, the low gain attenuating module 16 comprises an attenuation resistor R3, a resistor R4, a bipolar transistor Q5, and a current source ($I_{bias}$). The attenuation resistor R3 is coupled between RF input end (RF_in) and the RF output end (RF_out) through the bipolar transistor Q5 with its base coupled to a bias voltage ($V_{bias}$). The bipolar transistor Q5 functions as a current follower. The resistor R4 is coupled between the RF input end (RF_in) and ground through a switch (SW) which is switched on as the LNA 10 is operated in the low gain mode. The low gain attenuating module 16 further comprises a first capacitor C1 and a second capacitor C2 for blocking DC constituent of the RF input signal 20. The switch (SW) and the current source ($I_{bias}$) are also controlled by the gain control signal 24. When the gain control signal 24 is enabled to enter low gain mode, the switch (SW) and the transistor Q5 are on, the transistor Q1 is off, the RF input signal 20 is fed forward through the low gain attenuating module 16 to the RF output end (RF_out), and the resistors R3, R4 are used to compensate for input and output impedance. As a result, the attenuation resistor R3 allows the bandwidth of the LNA 10 to be increased and the operating range to be flattened. In addition, the DC biasing current (Iref) is preferably switched off in low-gain mode to save power.

The values of the resistors R3 and R4 are selected to maintain a substantially constant input reflection coefficient as long as the LNA 10 is switched from high gain mode to low gain mode. Preferably, the equivalent input impedance of the transistor Q5, the resistors R3, R4 combine with the off-chip input impedance matching unit 26 to match the input impedance to a 50 ohm ($\Omega$) (or 75 ohm, depending on design requirements). In this manner, the input impedance matching unit 26 may be selected to provide the desired input impedance (preferably 50$\Omega$ or 75$\Omega$) when the LNA 10 is in high gain mode, taking into consideration on the impedance of the active bipolar transistors Q0 and Q1. Then, when the LNA 10 is switched to low-gain mode, the resistors R3, R4 are coupled to the RF input end (RF_in) to maintain a constant input reflection coefficient.

The values of the components in the input impedance matching unit 26 and the output impedance matching unit 28 are preferably chosen according to the operational frequency of the LNA 10 in order to achieve input and output matching, preferably to a 50 ohm ($\Omega$) or 75 ohm ($\Omega$). In addition, the component values of the off-chip input impedance matching unit 26 and the output impedance matching unit 28 may be varied in order to adapt the LNA 10 shown in FIG. 1 to alternate near frequency bands. For example, the values of the off-chip input/output impedance matching element inductors L3, L4 shown in FIG. 2 may be varied to switch the operational frequency band of the LNA 10 between the PCS band (1.96 GHz) and the DCS band (1.84 GHz). Referring to FIG. 2, the input impedance matching unit 26 is an inductor L3, and the output impedance matching unit 28 comprises a capacitor C4 and an inductor L4. It should be noted, however, that other known impedance matching configurations may be utilized for the input impedance matching unit 26 and the output impedance matching unit 28.

Although the present invention has been explained by the embodiments shown in the drawings described above, it should be understood to the ordinary skilled person in the art that the invention is not limited to the embodiments, but rather the various changes or modifications thereof are possible without departing from the spirit of the invention. For example, the DC biasing generator 14 may be implemented using many known biasing circuits configured to form a current mirror with bipolar transistor Q0, and is not limited to the implementation illustrated in FIG. 1. Moreover, it should also be understood that the high gain amplifier module 12 has alternative embodiments such as a common-emitter transistor amplifier configuration or a single transistor.

Figure 3:
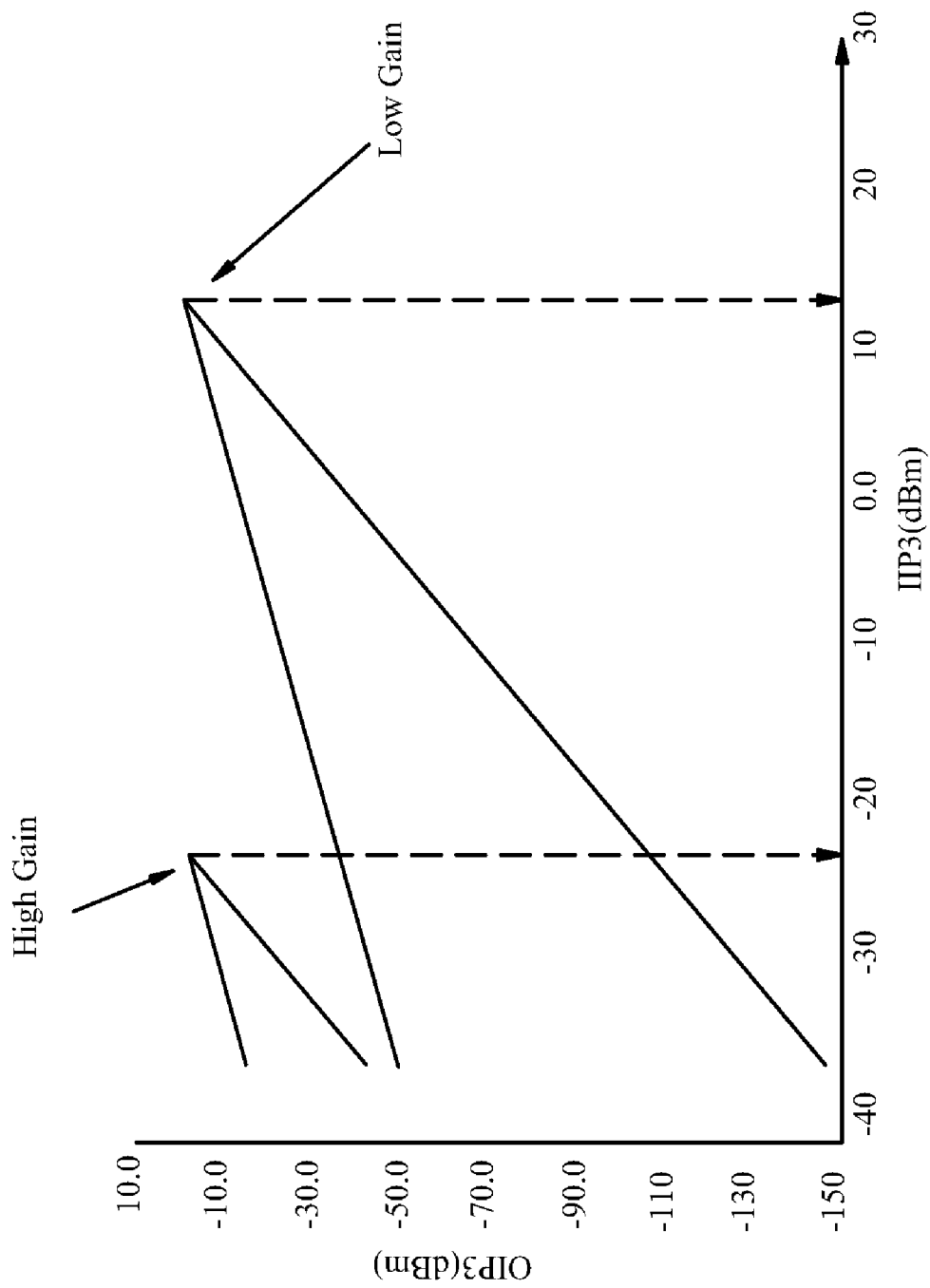
FIG. 3 shows a relationship of LNA depicted in FIG. 1 operated in high gain mode and low gain mode.

Please refer to FIG. 3, which shows a relationship between high gain mode and low gain mode which the LNA 10 depicted in FIG. 1 operates in. From FIG. 3, linearity and compression point of the LNA 10 are improved for low gain mode.

It is appreciated that, in a preferred embodiment, all of the circuit elements shown in FIG. 1 are located on a single integrated circuit (IC). To sum up, the present inventive low noise amplifier provides a high gain amplifier module for amplifying the weak RF signal to increase the receiver sensitivity, and a low gain attenuating module for attenuating the strong RF input signal and easing the linearity requirements for the following blocks. Furthermore, the low noise amplifier also performs impedance match under high and low gain conditions, and consumes lower power in the low gain mode and hence reduces the system power consumption. The low noise amplifier has one or more output ends OUT+ and OUT− (shown in FIG. 2) ac-coupled to a following block, e.g. a mixer, which can filter out the low frequency distortion generated by the low noise amplifier. The low gain attenuating module has two resistors in parallel, of which the first resistor is used to attenuating the RF input signal, and the parallel connection of the two resistors is used to compensate for input and output impedance, and to maintain a substantially constant input reflection coefficient as the LNA is in low gain mode.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

What is claimed is:

1. An amplifier comprising:
an amplifier module coupled to an input node; and
an attenuating module, comprising:
an attenuation resistor coupled to the input node; and
an impedance compensation module coupled to the input node, the impedance compensation module compensating an input impedance when an input RF signal is attenuated by the attenuating module, the impedance compensation module comprising a switch, a resistor coupled to the switch, and a capacitor coupled between the switch and the resistor.

2. The amplifier of claim 1, wherein the switch is implemented by a transistor.

3. The amplifier of claim 1, wherein the amplifier amplifying the input RF signal through the amplifier module in a first gain mode and amplifying the input RF signal through the amplifier module in a second gain mode.

4. The amplifier of claim 1, wherein the amplifier module comprises a first transistor and a second transistor.

5. The amplifier of claim 3, wherein the amplifier module comprises a first transistor and a second transistor and wherein the first and the second transistors are turned off in the second gain mode.

6. The amplifier of claim 1, wherein the attenuating module comprises a transistor.

7. The amplifier of claim 6, wherein the transistor is turned off in a first gain mode.

8. The amplifier of claim 1 further comprising an input impedance matching unit coupled to the amplifier module.

9. The amplifier of claim 8 wherein the input impedance matching unit is an inductor.

10. The amplifier of claim 1, further comprising a load impedance module having a plurality of output ends coupled to the amplifier though an impedance circuit.

11. An attenuating module, comprising:
a transistor;
an attenuation resistor coupled to an input of the transistor; and
an impedance compensation module coupled to the attenuation resistor, the impedance compensation module compensating an input impedance when an input RF signal is amplified by the attenuating module, the impedance compensation module comprising a switch, a resistor coupled to the switch, and a capacitor coupled between the switch and the resistor.

12. The attenuating module of claim 11, wherein the switch is implemented by a transistor.

13. A method for attenuating an RF signal, the method comprising:
attenuating an amplitude of an input RF signal by an attenuation resistor; and
compensating an input impedance by an impedance compensation module, the impedance compensation module comprising a resistor, a switch, and a capacitor coupled to the resistor and the switch in series.

14. An amplifier comprising:
an amplifier module coupled to an input node; and
an attenuating module, comprising:
an attenuation resistor coupled to the input node; and
an impedance compensation module coupled to the input node, the impedance compensation module compensating an input impedance when an input RF signal is attenuated by the attenuating module, the impedance compensation module comprising a switch, and a resistor and a capacitor coupled to the switch.

15. The amplifier of claim 14, wherein the resistor and the capacitor of the impedance compensation module are coupled in series to the switch, and the impedance compensation module and the attenuation resistor receives the input RF signal through the input node.

16. An amplifier comprising:
an amplifier module coupled to an input node; and
an attenuating module, comprising:
an attenuation resistor coupled to the input node; and
an impedance compensation module coupled to the input node, the impedance compensation module compensating an input impedance when an input RF signal is attenuated by the attenuating module, wherein the attenuation resistor and the impedance compensation module are arranged to receive the input RF signal through the input node.

17. An attenuating module, comprising:
a transistor;

an attenuation resistor coupled to an input of the transistor; and an impedance compensation module coupled to the attenuation resistor, the impedance compensation module compensating an input impedance when an input RF signal is amplified by the attenuating module, the impedance compensation module comprising a switch, and a resistor and a capacitor coupled to the switch.

18. The attenuating module of claim 17, wherein the resistor and the capacitor of the impedance compensation module are coupled in series to the switch, and the impedance compensation module and the attenuation resistor receives the input RF signal.

19. An attenuating module, comprising:

a transistor;

an attenuation resistor coupled to an input of the transistor; and an impedance compensation module coupled to the attenuation resistor, the impedance compensation module compensating an input impedance when an input RF signal is amplified by the attenuating module, wherein the attenuation resistor and the impedance compensation module are arranged to receive the input RF signal.

* * * * *